(12) United States Patent
Chuang et al.

(10) Patent No.: US 7,852,250 B2
(45) Date of Patent: Dec. 14, 2010

(54) DIGITAL TO ANALOG CONVERTER

(75) Inventors: Mei-Chen Chuang, Hsinchu (TW); Wen-Shen Chou, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 11 days.

(21) Appl. No.: 12/340,462

(22) Filed: Dec. 19, 2008

(65) Prior Publication Data

US 2009/0278723 A1    Nov. 12, 2009

Related U.S. Application Data

(60) Provisional application No. 61/051,514, filed on May 8, 2008.

(51) Int. Cl.
 *H03M 1/66* (2006.01)
(52) U.S. Cl. .................. 341/144; 341/135; 341/145

(58) Field of Classification Search .................. 341/135, 341/136, 144, 145
See application file for complete search history.

(56) References Cited

U.S. PATENT DOCUMENTS 7,068,201 B1 * 6/2006 Chou .......................... 341/144

* cited by examiner

*Primary Examiner*—Khai M Nguyen
(74) *Attorney, Agent, or Firm*—K&L Gates LLP

(57) ABSTRACT

This invention discloses a digital to analog converter (DAC) for converting a digital signal with a predetermined number of bits to a corresponding analog signal, the DAC comprises a first current source element having a first control signal, the first control signal controlling the conduction current provided by the first current source element, and a second current source element having a second control signal, the second control signal controlling the conduction current provided by the second current source element, wherein the first and the second control signals have different voltages during operation of the DAC.

10 Claims, 4 Drawing Sheets

DIGITAL TO ANALOG CONVERTER

PRIORITY DATA

The present invention claims priority to provisional patent application No. 61/051,514 filed May 8, 2008 entitled "DIGITAL TO ANALOG CONVERTER."

BACKGROUND

Various different kinds of digital to analog converters (DACs) are used to convert digital signals to analog signals. Binary weighted DAC's are used in many applications because they require relatively few components, and are thus relatively small. A binary weighted DAC includes a plurality of current or voltage generating elements. Each element corresponds to a bit of the incoming digital signal. The outputs of the different elements are weighted, based on the significance of their corresponding bits. Elements corresponding to more significant bits are weighted higher than elements corresponding to less significant bits. The sum of all of the outputs is equal to the output analog signal. Weighted binary DAC's are advantageous because they require a relatively small number of elements, and therefore can be implemented in a relatively small chip area. On the other hand, weighted binary DAC's often suffer from poor glitch performance. Also, to insure linear operation, the weighting of each element must be carefully tuned.

Thermometer coded DACs address some of the problems of binary weighted DACs. A thermometer coded DAC first converts binary input into thermometer code. Following Table 1 illustrates a conversion between the binary code and the thermometer code. As an example seven thermometer coded bits are required to represent three binary bits.

TABLE 1

| Decimal | Binary | | | Thermometer code | | | | | | |
|---|---|---|---|---|---|---|---|---|---|---|
| 0 | 0 | 0 | 0 | 0 | 0 | 0 | 0 | 0 | 0 | 0 |
| 1 | 0 | 0 | 1 | 0 | 0 | 0 | 0 | 0 | 0 | 1 |
| 2 | 0 | 1 | 0 | 0 | 0 | 0 | 0 | 0 | 1 | 1 |
| 3 | 0 | 1 | 1 | 0 | 0 | 0 | 0 | 1 | 1 | 1 |
| 4 | 1 | 0 | 0 | 0 | 0 | 0 | 1 | 1 | 1 | 1 |
| 5 | 1 | 0 | 1 | 0 | 0 | 1 | 1 | 1 | 1 | 1 |
| 6 | 1 | 1 | 0 | 0 | 1 | 1 | 1 | 1 | 1 | 1 |
| 7 | 1 | 1 | 1 | 1 | 1 | 1 | 1 | 1 | 1 | 1 |

A thermometer code DAC includes a current or voltage generating element for each possible value of the incoming digital signal. A decoder receives the incoming digital signal and derives a thermometer code. The thermometer code is a digital signal having one bit for each possible value of the incoming digital signal. The number of asserted bits in the thermometer code is proportional to the value of the incoming digital signal. Each bit of the thermometer code is provided to a corresponding element. When a bit is asserted, the corresponding element generates an output (i.e., a current or voltage). Unlike those of binary weighted DAC's, all of the element outputs in a thermometer DAC are equal. The sum of the outputs over all of the elements is the output analog signal. Thermometer code DAC's have glitch properties more favorable than those of binary weighted DAC's and are simpler to calibrate. Because a separate element is required for each allowed value, however, thermometer code DAC's require many components and have a large chip area.

FIG. 1 is a schematic diagram illustrating a current source section of a conventional binary and thermometer-coded hybrid DAC 100. The hybrid DAC 100 has twelve bits. A binary 110 block converts the four least significant bits (LSBs) to analog currents, and a thermometer coded block 120 converts the eight most significant bits (MSBs) to analog currents. These analog currents are summed up to represent a converted analog signal. Specifically, the current source for the binary block 110 comprises four PMOS transistors B[0:3]. If the PMOS transistor B[0] for the LSB has one leg, i.e., M=1, the PMOS transistor B[1], B[2] and B[3] for the upper bits will have 2, 4 and 8 legs, respectively. Referring to FIG. 1, the number of legs is represented by the M number. The more the number of legs the larger the conduction current i[0:3]. Thereby, the PMOS transistor B[1] is twice as large in size and conduction current as the PMOS transistor B[0], i.e., i[1]=2*i[0]. Similarly, i[2]=2*i[1], and i[3]=2*i[2]. Then the binary block 110, when all transistors are on, produces a total amount of current of 15*i[0].

Referring again to FIG. 1, the thermometer coded block 120 has 255 parallel connected PMOS transistors T[1:255] of identical sizes, i.e., all have 16 legs (M=16). Conduction current by any of the PMOS transistor T[1:255] is 16 times of the i[0], i.e., j=16*i[0]. A total current the 12-bit DAC 100 can produce equals then to (255*16+15)*i[0]=4095*i[0]. This means a current source area for the 12-bit DAC 100 occupies 4095 legs of the basic PMOS transistor B[0]. The thermometer coded DAC also requires a binary to thermometer code decoder. While the thermometer coded DAC improves accuracy and conversion speed of a DAC, it also takes up a larger chip area than a pure binary DAC and hence increases cost.

FIG. 2 is a schematic diagram illustrating a current source section of an alternative conventional binary and thermometer-coded hybrid DAC 200. The hybrid DAC 200 has also 12-bits. The 4-bit binary block 110 is the same as in FIG. 1. The eight most-significant-bits are divided into two thermometer coded blocks 220 and 230. The thermometer coded block 220 converts two binary bits, and therefore, has three thermometer coded bits and employing three PMOS transistors S[1:3] having 16 legs, i.e., M=16. Their conduction current k=16*i[0]. The thermometer coded block 230 converts 6 most significant binary bits, and therefore has sixty three thermometer coded bits and employing sixty three PMOS transistors T[1:63]. M=64 for the PMOS transistors T[1:63], therefore, the conduction current of each transistor m=64*i[0]. A total current of the hybrid DAC 200 is (63*64+3*16+15)*i[0]=4095*i[0]. The hybrid DAC 200 occupies the same among of chip area as the hybrid DAC 100. They both have the disadvantage of large chip area and high cost.

SUMMARY

This invention discloses a digital to analog converter (DAC) for converting a digital signal with a predetermined number of bits to a corresponding analog signal. The DAC comprises a first current source element having a first control signal, the first control signal controlling the conduction current provided by the first current source element, and a second current source element having a second control signal, the second control signal controlling the conduction current provided by the second current source element, wherein the first and the second control signals have different voltages during operation of the DAC.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein.

DESCRIPTION

Figure 1:
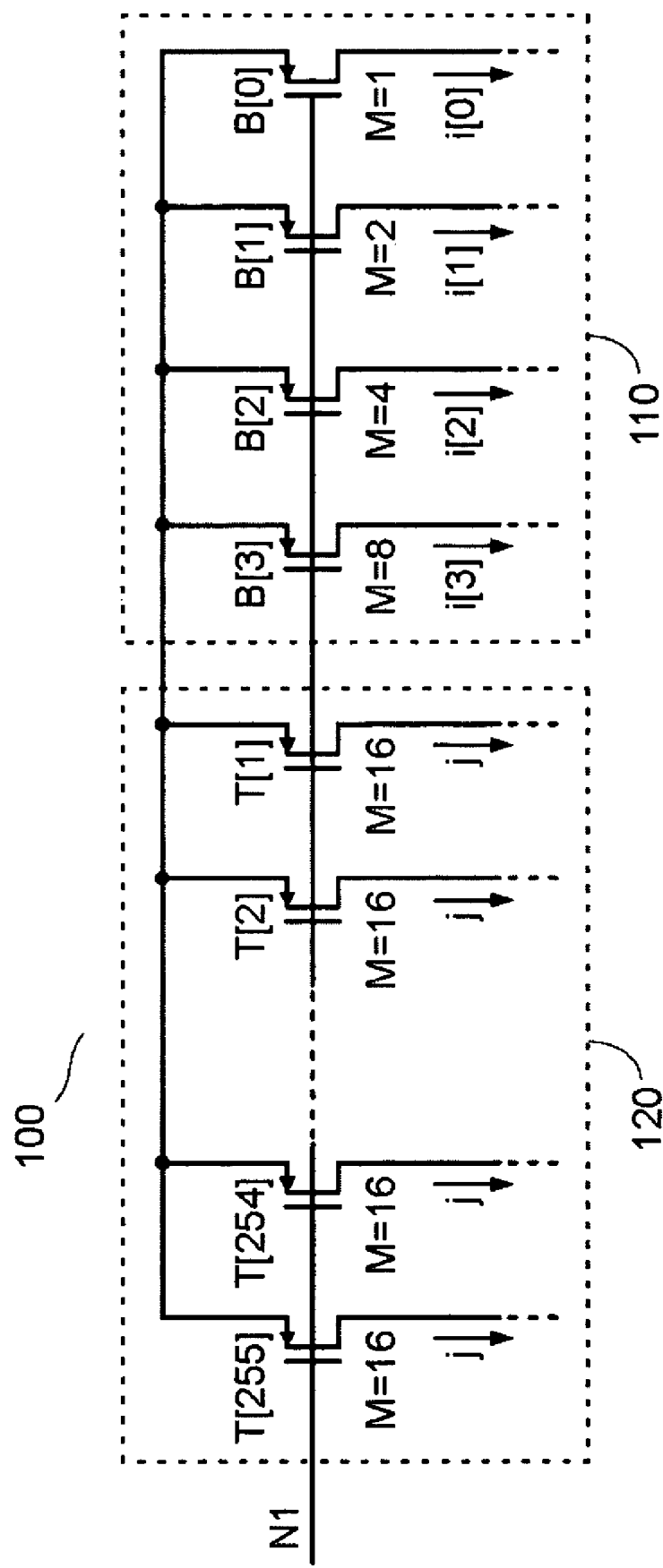
FIG. 1 is a schematic diagram illustrating a current source section of a conventional binary and thermometer-coded hybrid DAC.
Figure 2:
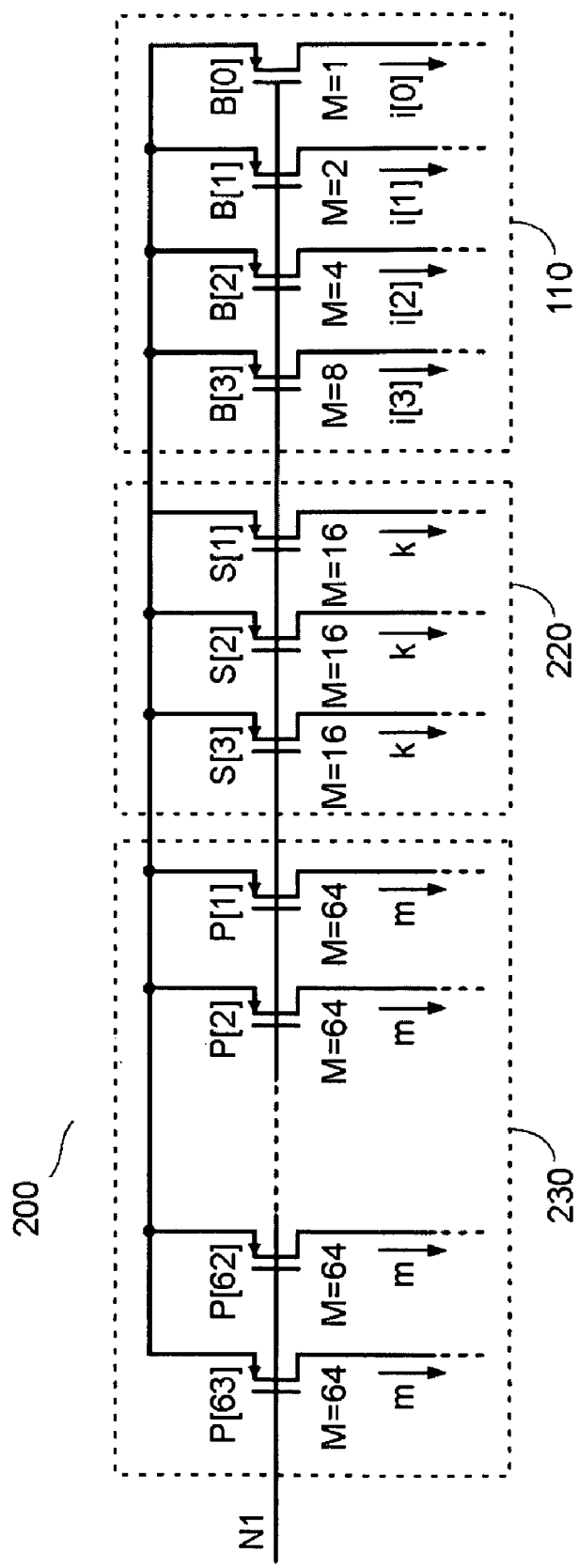
FIG. 2 is a schematic diagram illustrating a current source section of an alternative conventional binary and thermometer-coded hybrid DAC.

The conventional current source for digital-to-analog converters (DACs) as shown in FIGS. 1 and 2, scales transistor sizes to obtain weighted currents for each individual bit. The more bits the DAC has, the larger the transistor sizes become for more significant bits. The present invention discloses a current source scheme that scales transistor biasing instead of sizes to achieve weighted currents for various bits.

Referring back to FIGS. 1 and 2, each current source element in the binary block 110 of either FIG. 1 or FIG. 2, or the thermometer coded blocks 120, 220 and 230, is a PMOS transistor. When a saturated PMOS transistor is biased at a different gate voltage, its source-drain conduction current follows approximately following equation:

$$I_{ds} = \frac{\mu_n C_{ox}}{2} \frac{W}{L} (V_{GS} - V_{th})^2 \quad \text{Eq. 1}$$

Where, $I_{ds}$ is the source-drain conduction current, $V_{GS}$ is the gate bias voltage, $V_{th}$ is the threshold voltage, W and L are transistor channel width and length, respectively. The conventional method of scaling the conduction current is through changing the transistor channel width W. According one embodiment of the present invention, the transistor gate bias voltage $V_{GS}$ is adjusted to achieve conduction current $I_{ds}$ scaling effect. According to Eq. 1, adjusting $V_{GS}$ is more effective as the conduction current, $I_{ds}$, is proportional to the $V_{GS}$ square.

Figure 3:
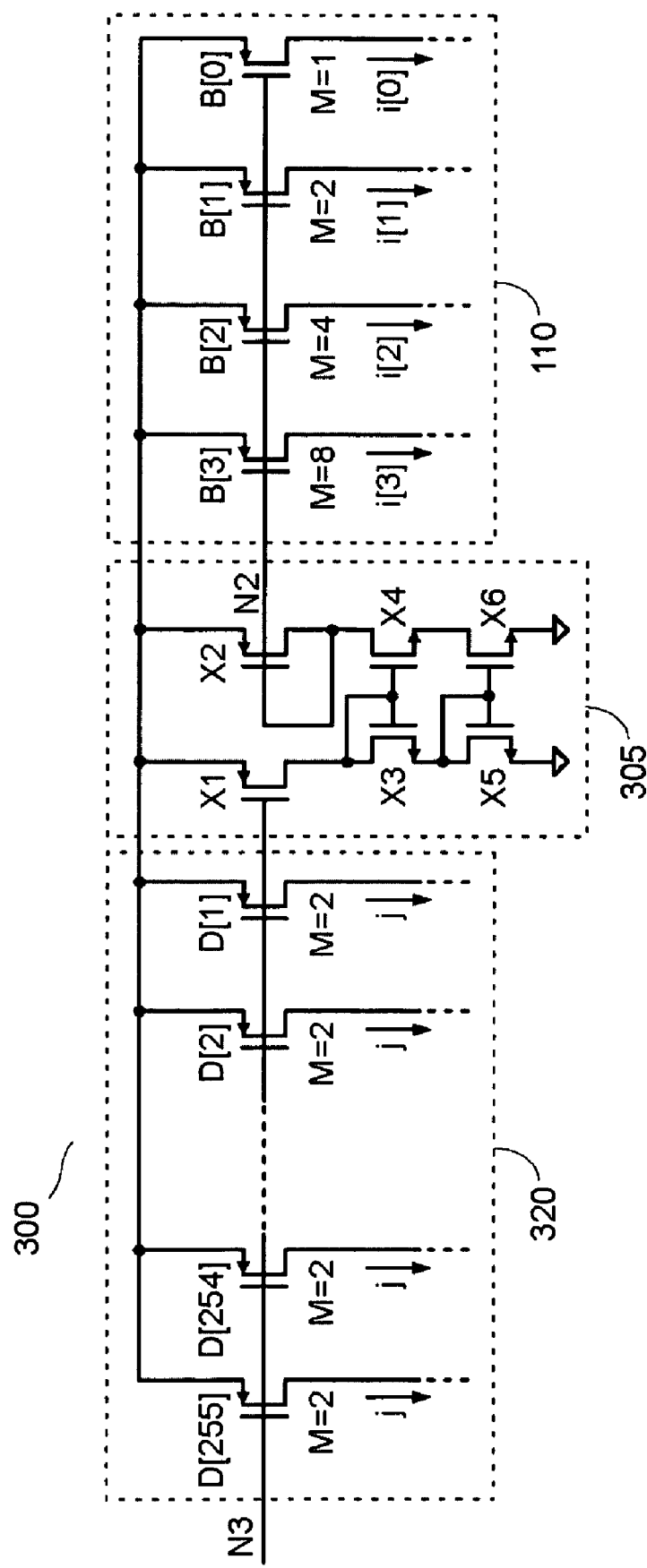
FIG. 3 is a schematic diagram of a current source section of a hybrid DAC according to one embodiment of the present invention.

FIG. 3 is a schematic diagram of a current source section of a hybrid 12-bit DAC 300 according to one embodiment of the present invention. Four least significant bits are still converted by the binary block 110 as depicted in FIGS. 1 and 2. Eight most significant bits are converted by a thermometer coded block 320 which has 255 current source elements D[1:255].

The current source elements D[1:255] are exemplarily implemented by PMOS transistors. Conduction current j, for each current source elements D[1:255] are the same, as they are biased by the same node N1 and have an identical transistor size. As discussed in the background section, conduction current j=2*i[3]. To achieve this, conventional method is to make the PMOS transistor T[1] twice as large as the PMOS transistor B[3] while all the PMOS transistors B[0:3] and T[1:255] are biased the same as shown in FIG. 1. According to the embodiment of the present invention, the PMOS transistors B[0:3] are biased by a node N2, and the PMOS transistors D[1:255] are biased by a node N3. Then the conduction currents can be expressed by following equations:

$$j = \frac{\mu_n C_{ox}}{2} \frac{W_D}{L} (V_{N3} - V_{th})^2 \quad \text{Eq. 2}$$

$$i[3] = \frac{\mu_n C_{ox}}{2} \frac{W_B}{L} (V_{N2} - V_{th})^2 \quad \text{Eq. 3}$$

where, $W_D$ is the channel width of the PMOS transistors D[1:255], $W_{B[3]}$ is the channel width of the PMOS transistors B[3], $V_{N3}$ is the biasing voltage at the node N3, and $V_{N2}$ is the biasing voltage at the node N2. As an example, the PMOS transistors D[1:255] have 2 legs (M=2), while the PMOS transistor B[3] has 8 legs (M=8), thus $W_D = W_{B[3]}/4$. In order to make j=2*i[3], the biasing voltages are then set according to following equation:

$$W_D (V_{N3} - V_{th})^2 = 2 \cdot W_{B[3]} (V_{N2} - V_{th})^2 \quad \text{Eq. 4}$$

$$\text{or } (V_{N3} - V_{th})^2 = 8 \cdot (V_{N2} - V_{th})^2 \quad \text{Eq. 5}$$

Referring again to FIG. 3, the different biasing voltages, $V_{N3}$ and $V_{N2}$, is achieved by the current mirror circuit 305. The current mirror circuit 305 comprises a pair of PMOS transistors X1 and X2, and NMOS transistors X3, X4, X5 and X6. The cascoded NMOS transistors X3 and X4 provide biasing for the PMOS transistor X1. Similarly, the cascoded NMOS transistors X4 and X6 provide biasing for the PMOS transistor X2. The node N2 is connected to a gate of the PMOS transistor X2. The node N3 is connected to a gate of the PMOS transistor X1. When transistor sizes of X1, X3 and X5 equal the transistor sizes of X2, X4 and X5, respectively, a conduction current flowing through the PMOS transistor X1 equals the conduction current flowing through the PMOS transistor X2. In this case, the voltage $V_{N2}$ becomes the same as the voltage $V_{N3}$. Through adjusting the ratio of the transistor sizes between the transistor group comprised of X1, X3, X5, and the transistor group comprised of X2, X4 and X6, a desired voltage ratio between $V_{N2}$ and $V_{N3}$ can be achieved. The mechanism of the current mirror circuit 305 is well known in the art. In fact, the current mirror circuit 305 is only one of many ways to control the ratio between the voltages, $V_{N2}$ and $V_{N3}$.

Referring again to FIG. 3, the current sources of the thermometer coded block 320 have a total transistor leg number of 255*2=510, while the similar circuit, block 120 in FIG. 1, has a total transistor leg number of 255*16=4080. Apparently, the present invention causes a large amount of transistor size reduction, and therefore reducing chip size and cost of the DAC 300.

Figure 4:
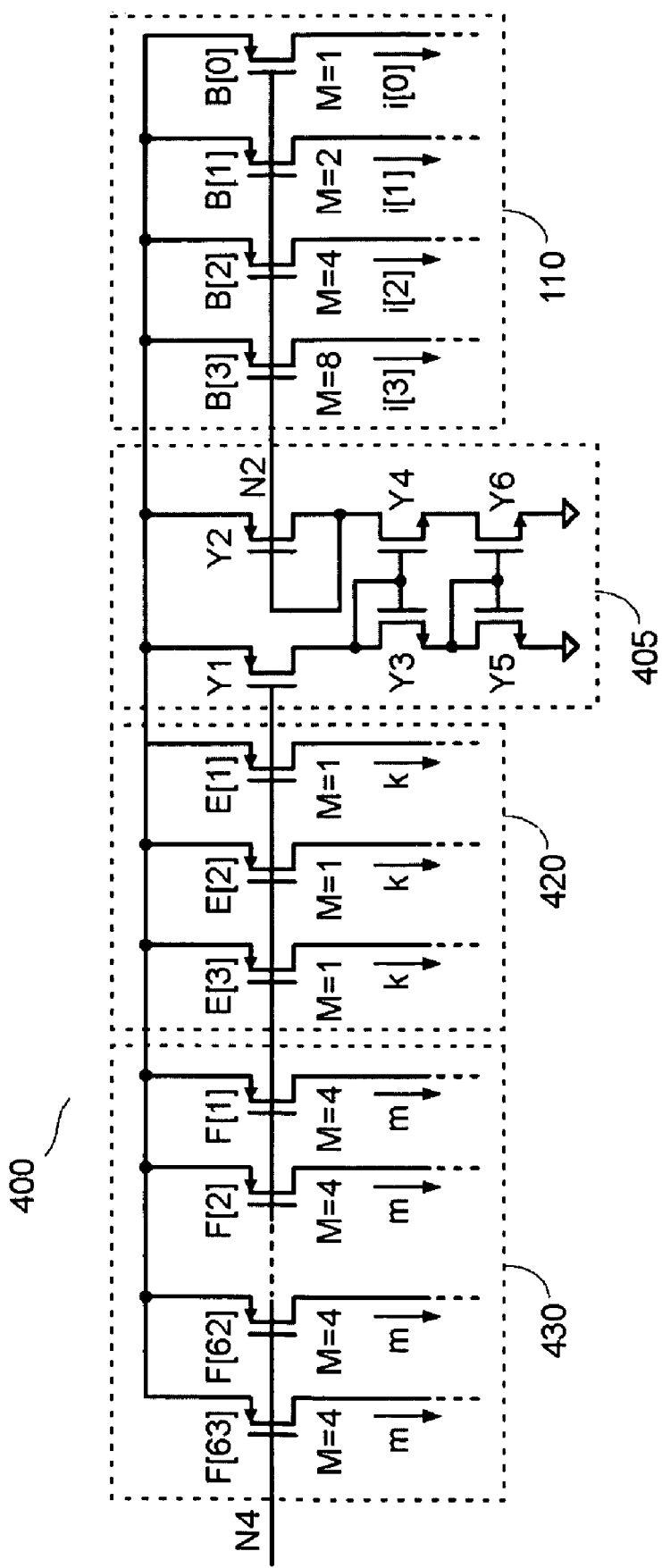
FIG. 4 is a schematic diagram of a current source section of a hybrid DAC according to another embodiment of the present invention.

FIG. 4 is a schematic diagram of a current source section of an alternative 12-bit hybrid DAC 400 according to the embodiment of the present invention. The current source section of the DAC 400 comes from applying a current mirror circuit 405 to the current source section of the DAC 300 in FIG. 2. A thermometer coded block 420 corresponds to the thermometer coded block 220 of FIG. 2. The thermometer coded block 430 corresponds to the thermometer coded block 230 of FIG. 2. The current mirror circuit 405 has identical structure as the current mirror circuit 305 of FIG. 3. The transistor sizes of the current mirror circuit 405 is so adjusted for controlling biasing voltages at nodes N2 and N4, even though each of the transistors E[1:3] is eight time smaller in size than the transistor B[3], the conduction current of each of the transistors E[1:3] is still twice as large as the conduction current of the transistor B[3], i.e., k=2*k[3]. With the transistors E[3] having only one leg each and the transistors F[1:63] having four legs each, a total transistor leg count of the thermometer blocks 420 and 430 is (63*4+3*1)=255. Apparently the current source section of the DAC 400 provides more dramatic transistor size reduction.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A digital to analog converter (DAC) for converting a digital signal with a predetermined number of bits to a corresponding analog signal, the DAC comprising:
   a first current source element having a first control signal, the first control signal controlling the conduction current provided by the first current source element;
   a second current source element having a second control signal, the second control signal controlling the conduction current provided by the second current source element; and
   a current mirror circuit connected to both the first and the second control signals for determining a voltage ratio between the first and the second control signal, the current mirror circuit comprises:
   a first PMOS transistor (P1) having a gate connected to the first control signal;
   a second PMOS transistor (P2) having a gate connected to the second control signal;
   a first NMOS transistor (N1) and a second NMOS transistor (N2) connected in series and coupled to the P1 to provide a first biasing voltage for the P1; and
   a third NMOS transistor (N3) and a fourth NMOS transistor (N4) connected in series and coupled to the P2 to provide a second biasing voltage for the P2,
   wherein a ratio of transistor sizes between a first transistor group comprising P1, N1, N2 and a second transistor group comprising P2, N3, N4 is adjusted such that the first and the second control signals have different voltages during operation of the DAC.

2. The DAC of claim 1, wherein the first and second current source elements are adjacent to each other.

3. The DAC of claim 1, wherein the first control signal controls a first plurality of current source elements including the first current source element, and the second control signal controls a second plurality of current source elements including the second current source element.

4. The DAC of claim 1, wherein the first current source element belongs to a thermometer coded converter module while the second current source element belongs to a binary converter module.

5. The DAC of claim 1, wherein the first current source element comprises a first PMOS transistor having a gate connected to the first control signal and the second current source element comprises a second PMOS transistor having a gate connected to the second control signal.

6. The DAC of claim 1, wherein the current mirror circuit is connected to both the first and the second control signals for determining a voltage ratio between the first and the second control signal.

7. A digital to analog converter (DAC) for converting a digital signal with a predetermined number of bits to a corresponding analog signal, the DAC comprising:
   a first current source element belonging to a thermometer coded converter module and having a first control signal, the first control signal controlling the conduction current provided by the first current source element;
   a second current source element belonging to a binary converter module and having a second control signal, the second control signal controlling the conduction current provided by the second current source element; and
   a current mirror circuit connected to both the first and the second control signals for determining a voltage ratio between the first and the second control signal, the current mirror circuit comprises:
   a first PMOS transistor (P1) having a gate connected to the first control signal;
   a second PMOS transistor (P2) having a gate connected to the second control signal;
   a first NMOS transistor (N1) and a second NMOS transistor (N2) connected in series and coupled to the P1 to provide a first biasing voltage for the P1; and
   a third NMOS transistor (N3) and a fourth NMOS transistor (N4) connected in series and coupled to the P2 to provide a second biasing voltage for the P2,
   wherein a ratio of transistor sizes between a first transistor group comprising P1, N1, N2 and a second transistor group comprising P2, N3, N4 is adjusted such that the first and the second control signals have different voltages during operation of the DAC.

8. The DAC of claim 7, wherein the first and second current source elements are adjacent to each other.

9. The DAC of claim 7, wherein the first control signal controls a first plurality of current source elements including the first current source element, and the second control signal controls a second plurality of current source elements including the second current source element.

10. The DAC of claim 7, wherein the current mirror circuit is connected to both the first and the second control signals for determining a voltage ratio between the first and the second control signal.

* * * * *